United States Patent
Fechtig et al.

(10) Patent No.: US 6,373,720 B1
(45) Date of Patent: *Apr. 16, 2002

(54) MODULE WITH ELECTRONIC COMPONENTS

(75) Inventors: Helmut Fechtig, Bonndorf; Heinz Neukum, Stühlingen, both of (DE)

(73) Assignee: Alcatel, Paris (FR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/293,998

(22) Filed: Apr. 19, 1999

(30) Foreign Application Priority Data

Apr. 22, 1998 (DE) .......................... 198 17 850

(51) Int. Cl.[7] .............................. H05K 7/02; H05K 7/10
(52) U.S. Cl. .................... 361/823; 361/306.1; 361/808; 361/811; 361/812; 439/709; 439/722
(58) Field of Search ............................ 361/307, 306.1, 361/823, 824, 807, 808, 811–813, 820, 821; 439/709, 720, 721, 722, 736; 310/71

(56) References Cited

U.S. PATENT DOCUMENTS

| | | | | |
|---|---|---|---|---|
| 2,057,718 A | | 10/1936 | Gunthorp ..................... | 439/389 |
| 2,099,555 A | | 11/1937 | Benander ..................... | 439/692 |
| 2,636,067 A | * | 4/1953 | Kraft .......................... | 439/709 |
| 2,857,583 A | * | 10/1958 | Markley et al. ............. | 439/722 |
| 3,149,264 A | * | 9/1964 | Richards ...................... | 361/823 |
| 3,284,258 A | * | 11/1966 | Patti et al. .................. | 439/722 |
| 3,327,174 A | * | 6/1967 | Barre et al. ................. | 439/722 |
| 3,512,121 A | * | 5/1970 | Bergeron ..................... | 439/722 |
| 3,585,570 A | * | 6/1971 | Jans ........................... | 439/722 |
| 3,772,638 A | * | 11/1973 | Schoelles .................... | 439/720 |
| 3,846,740 A | * | 11/1974 | Damon ........................ | 439/748 |
| 3,978,375 A | * | 8/1976 | Fukui et al. ................. | 361/813 |
| 4,089,041 A | * | 5/1978 | Lockard ....................... | 361/767 |
| 4,159,500 A | * | 6/1979 | Baumbach et al. .......... | 439/721 |
| 4,428,633 A | * | 1/1984 | Lundergan et al. ........... | 439/70 |
| 4,611,262 A | * | 9/1986 | Galloway et al. ............ | 361/813 |
| 4,754,368 A | | 6/1988 | Bullock et al. .............. | 361/668 |
| 4,766,520 A | * | 8/1988 | Hubert et al. ................ | 361/813 |
| 5,012,391 A | * | 4/1991 | Schultz, Jr. et al. ......... | 361/826 |
| 5,148,347 A | | 9/1992 | Cox et al. .................... | 361/272 |
| 5,777,851 A | * | 7/1998 | Yamamoto ................... | 361/813 |
| 6,310,780 B1 | * | 10/2001 | Tamura et al. .............. | 361/807 |

FOREIGN PATENT DOCUMENTS

| | | |
|---|---|---|
| DE | 27 20 438 A1 | 11/1977 |
| DE | 3439410 A1 | 4/1986 |
| DE | 3345701 A1 | 6/1986 |

* cited by examiner

*Primary Examiner*—Jayprakash N. Gandhi
*Assistant Examiner*—John B. Vigushin
(74) *Attorney, Agent, or Firm*—Sughrue Mion, PLLC

(57) ABSTRACT

A module with electronic components mounted on a carrier and electrically interconnected in accordance with a predefined circuit. Such a module, distinguished by particular variability, ease of assembly, compactness and applicability for high currents, is characterized in that the carrier is an injection molded plastic part (1), into which flat connectors (3) for receiving the components may be inserted.

16 Claims, 1 Drawing Sheet

MODULE WITH ELECTRONIC COMPONENTS

This application is based on and claims the benefit of German Patent Application No. 198 17 850.6 filed Apr. 22, 1998, which is incorporated by reference herein.

BACKGROUND OF THE INVENTION

The invention relates to a module with electronic components.

Modules with electronic components for mass products must be easy to assemble and cost effective on the one hand, and permit problem-free changes or improvements despite a large number of variants on the other hand. It is known that a printed circuit board is used to carry different components. The components are assembled and soldered onto the board to form a module. The disadvantage, in addition to the significant assembly and material costs, is primarily that the cross section of the solder paths is restricted to relatively small values. As a result, the printed circuit board variant has limited application for high currents in the ampere range. In addition, either very large distances between the individual components or additional insulation strips are required. The reject rate is relatively high, since printed conductors may be torn loose during soldering. To realize different circuits and component dimensions, special boards are required.

SUMMARY OF THE INVENTION

An object of the invention is to define a module with electronic components of the generic type, which is distinguished by its variability, ease of assembly, cost savings, applicability for higher currents and reduced reject rate.

According to the invention, this and other objects are achieved by a module that includes an injection-molded plastic carrier; flat connectors that are received by the injection-molded plastic carrier; and electronic components, which are received in the flat connectors. Therein, the electronic components and the flat connectors form an electrical circuit. The injection molded plastic part is substantially cheaper than the printed circuit board and makes it possible to implement shapes of any kind without problems. The flat connectors for receiving the components can be inserted in the injection molded plastic part in a technologically simple manner. This eliminates solder paths and soldered connections. High currents can be realized without hesitation. Depending on the positioning of the connectors, very different circuits can be assembled on an injection molded plastic part.

The flat connector are preferably designed to be capable of being pressed into the injection molded plastic part. This facilitates assembly and provides a robust module that is largely protected against mechanical damage.

In an advantageous embodiment for fixing the flat connectors to the injection molded plastic part, the feet shapes of the flat connectors, in conjunction with corresponding indentations in the injection molded part and adapted particularly for a press fit, guarantee a solid and, where necessary, nevertheless detachable connection between the flat connectors and the injection molded plastic part.

For this purpose, the feet shapes are advantageously provided with L-shaped bends. These bends and possibly barb-like feet shapes permit simple and correct orientation during assembly of the non-symmetrical flat connectors in conjunction with a highly robust snug fit.

In an advantageous embodiment, the flat connectors are preferably equipped with standard flat connector lugs. With respect to the receptacles of various components, the lugs can have a cross-section of, for example, 2.8 mm by 0.8 mm. Other dimensions are also possible, however, whereby the standard longitudinal dimension of the cross section can be staggered 4.8 mm, 6.3 mm, etc.

The insulation ridges between the flat connector lugs result in a highly compact design of the module. Since the insulation ridges, as well as all the other shapes of the injection molded plastic parts, can be predefined by the die, separate assembly of these insulation ridges - in contrast to the printed circuit board variant - falls away.

In an advantageous embodiment, the components are arranged on both sides of the injection molded part. The electrical connection between the two sides may be realized, for example, by two soldered joints that connect the connector feet and the connections of the components to be mounted on the opposite side.

For example, components for a motor circuit may be mounted on the one side and a relatively large capacitor on the other. Such a module is known in the form of a wiring unit with capacitor for a motor for venetian blinds, particularly a venetian blind motor with medium-high rating.

BRIEF DESCRIPTION OF THE DRAWINGS

The invention will be more clearly understood from the description below in conjunction with the accompanying drawings, wherein.

DETAILED DESCRIPTION OF THE INVENTION

Figure 1A:
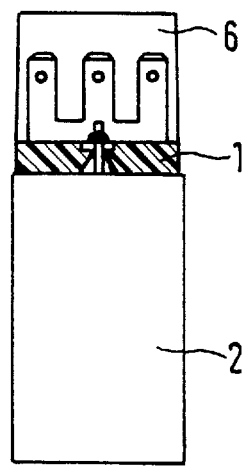
FIG. 1a is a sectional representation along Line A—A of FIG. 1b of a module according to the invention.
Figure 1B:
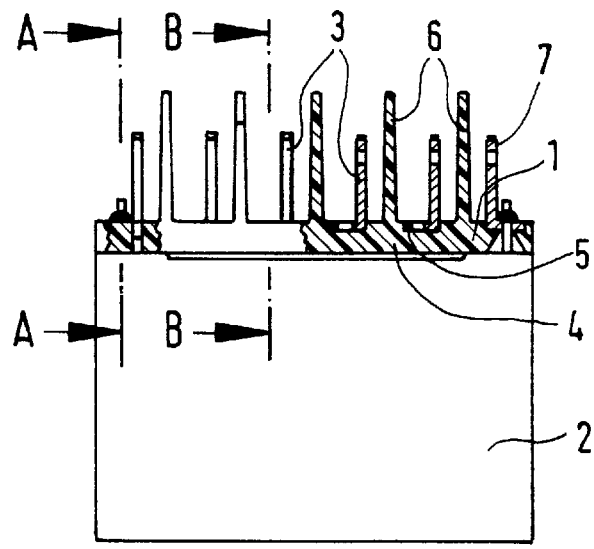
FIG. 1b is a front view of the module with partial cut-away.
Figure 1C:
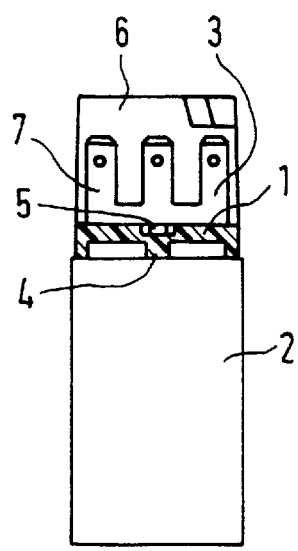
FIG. 1c is a sectional representation along line B—B in FIG. 1b
Figure 1D:
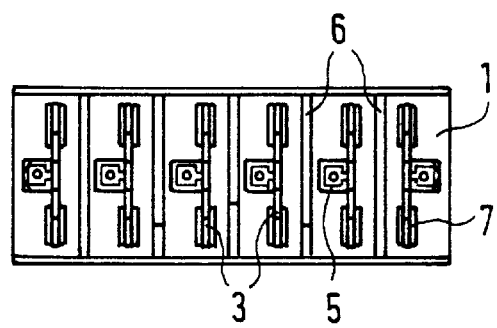
FIG. 1d is a top view of the module.

The module depicted in FIGS. 1a through 1d forms part of a venetian blind motor of medium-high rating. The module essentially comprises an injection molded part 1, a capacitor 2 soldered onto the undersurface of the injection molded part 1 and flat connectors 3 mounted on the top surface. Flat connectors 3 with feet shapes 5 are pressed into corresponding indentations 4 in the injection molded part 1. Between the flat connectors 3, insulation ridges 6 are arranged which rise above the flat connector lugs 7 and are shaped as part of the injection molded plastic part 1. Connector lugs 7 serve to receive corresponding receptacles of non-depicted components such as, for example, coils and circuits. This injection molded part 1/flat connector 3 embodiment makes the module highly compact, robust and equally suitable for a variety of circuits and module dimensions.

The invention is not limited to the above-described exemplary embodiment. A number of variants are feasible, which make use of the inventive features even though their basic embodiment may be different.

What is claimed is:

1. A module, comprising:
   an injection-molded plastic carrier;
   a plurality of flat connectors, each of which is independently received by a corresponding predefined recess of the injection molded plastic carrier; and
   a plurality of electronic components, which are received in respective ones of the plurality of flat connectors;

wherein the plurality of electronic components and the respective ones of the plurality of flat connectors form an electrical circuit.

2. The module according to claim 1, wherein the flat connectors are respectively structured to be pressed into the injection-molded plastic carrier.

3. The module according to claim 1, wherein the flat connectors respectively comprise standard flat connector lugs.

4. The module according to claim 3, wherein the injection-molded plastic carrier comprises insulation ridges that rise between the respective standard flat connector lugs.

5. The module according to claim 1, wherein the electronic components are arranged on two sides of the injection-molded plastic carrier.

6. The module according to claim 5, wherein the flat connectors are structured to be pressed into the injection-molded plastic carrier; wherein respective ones of the flat connectors receive components for a first side of the injection-molded plastic carrier; and wherein a capacitor is soldered onto a second side of the injection-molded plastic carrier.

7. A module, comprising:

an injection-molded plastic carrier;

a plurality of flat connectors, which are received by the injection-molded plastic carrier; and a plurality of electronic components, which are received in respective ones of the plurality of flat connectors;
wherein the plurality of electronic components and the respective ones of the plurality of flat connectors form an electrical circuit;
wherein the flat connectors respectively comprise feet; and
wherein the injection-molded plastic carrier comprises indentations to respectively receive the feet of the plurality of flat connectors.

8. The module according to claim 7, wherein each of the plurality of flat connectors is L-shaped.

9. A module, comprising:

an injection-molded plastic carrier;

a plurality of flat connectors, all of which are arranged on an outer surface of the injection-molded plastic carrier; and a plurality of electronic components, which are received in respective ones of the plurality of flat connectors;
wherein the plurality of electronic components and the respective ones of the plurality of flat connectors form an electrical circuit.

10. The module according to claim 9, wherein the flat connectors are respectively structured to be pressed into the injection-molded plastic carrier.

11. The module according to claim 9, wherein the flat connectors respectively comprise feet; and wherein the injection-molded plastic carrier comprises indentations to respectively receive the feet of the plurality of flat connectors.

12. The module according to claim 11, wherein each of the plurality of flat connectors is L-shaped.

13. The module according to claim 9, wherein the flat connectors respectively comprise standard flat connector lugs.

14. The module according to claim 13, wherein the injection-molded plastic carrier comprises insulation ridges that rise between the respective standard flat connector lugs.

15. The module according to claim 9, wherein the electronic components are arranged on two sides of the injection-molded plastic carrier.

16. The module according to claim 15, wherein the flat connectors are structured to be pressed into the injection-molded plastic carrier; wherein respective ones of the flat connectors receive components for a motor circuit on a first side of the injection-molded plastic carrier; and wherein a capacitor is soldered onto a second side of the injection-molded plastic carrier.

* * * * *